United States Patent
Seko

(10) Patent No.: US 6,710,458 B2
(45) Date of Patent: Mar. 23, 2004

(54) TAPE FOR CHIP ON FILM AND SEMICONDUCTOR THEREWITH

(75) Inventor: Toshiharu Seko, Yamabe-gun (JP)

(73) Assignee: Sharp Kabushiki Kaisha, Osaka (JP)

(*) Notice: Subject to any disclaimer, the term of this patent is extended or adjusted under 35 U.S.C. 154(b) by 3 days.

(21) Appl. No.: 09/975,066

(22) Filed: Oct. 12, 2001

(65) Prior Publication Data
US 2002/0043704 A1 Apr. 18, 2002

(30) Foreign Application Priority Data
Oct. 13, 2000 (JP) .................................. 2000-313485

(51) Int. Cl.[7] .............................................. H01L 23/48
(52) U.S. Cl. ................... 257/778; 257/780; 257/781; 257/787; 257/737; 257/738; 257/668; 257/795
(58) Field of Search .......................... 257/778, 780–781, 257/787, 737–738, 668, 795

(56) References Cited

U.S. PATENT DOCUMENTS 4,280,132 A * 7/1981 Hayakawa et al. ......... 257/667
5,953,814 A * 9/1999 Sozansky et al. .......... 228/180.22
6,157,085 A * 12/2000 Terashima .................. 257/691
6,287,895 B1 * 9/2001 Sato ........................... 438/106

FOREIGN PATENT DOCUMENTS

JP          9-129686 A          5/1997

* cited by examiner

Primary Examiner—Evan Pert
Assistant Examiner—Luan Thai
(74) Attorney, Agent, or Firm—Nixon & Vanderhye P.C.

(57) ABSTRACT

A dummy pattern for preventing generation of air bubbles in resin sealing of a semiconductor element is provided at a corner of the semiconductor element on a tape carrier which is composed of a polyimide-based insulating tape and a copper foil pattern formed thereon. The dummy pattern makes it possible to control flow of sealing resin from the corner of the semiconductor element to a space between a lower surface of the semiconductor element and the insulating tape, resulting in prevention of air bubbles generated in resin sealing of the semiconductor element. A generation rate of air bubble can be decreased to 50% or less as compared with a conventional COF semiconductor device.

29 Claims, 8 Drawing Sheets

TAPE FOR CHIP ON FILM AND SEMICONDUCTOR THEREWITH

BACKGROUND OF THE INVENTION

The present invention relates to a tape used for COF (chip on film) where a semiconductor element is mounted on a flexible circuit board, and to a semiconductor device formed with the tape for COF.

As a semiconductor device formed with a semiconductor element coupled to and mounted on a flexible circuit board, there has been known a TCP (Tape Carrier Package) semiconductor device. The TCP semiconductor device is provided with an insulating tape having a penetrating opening in which a semiconductor element is mounted, and a tip portion of an wiring pattern is coupled to the semiconductor element in a state that the wiring pattern is protruded like a cartilever. There has been another semiconductor device, as shown in FIG. 15, formed with a semiconductor element coupled to and mounted on a flexible circuit board. In this semiconductor device, a thin film insulating tape 1 does not have a penetrating opening in which a semiconductor element 2 is to be mounted, and a bump 3 of the semiconductor element 2 is coupled to and mounted on an inner lead 4 which is formed on the surface of the thin film insulating tape 1. In addition, reference numeral 5 denotes a sealing resin, and 6 denotes a solder resist. Hereinafter, the latter semiconductor device is referred to as a COF semiconductor device.

In the COF, there is used the thin film insulating tape 1 which has foldability in consideration of its application. Each wire in an wiring pattern disposed on the surface of the thin film insulating tape 1 is electrically connected to a corresponding terminal of the semiconductor element 2, and a connector section for external connection is connected to a liquid-crystal display panel, a printed circuit board and the like. Other exposed portions of the wiring pattern are insulated by a solder resist 6 applied thereon.

In the COF semiconductor device, as shown in FIG. 15, the semiconductor element 2 mounted on the thin film insulating tape 1 is sealed with a sealing resin 5. If air is involved during resin sealing, air bubbles easily generate in the sealing resin since the thin film insulating tape 1 is not provided with an opening in which the semiconductor element 2 is to be mounted. During resin sealing, the sealing resin 5 is applied or injected along each side of the semiconductor element 2. During application of the sealing resin 5 along four sides of the semiconductor element 2, part of air present between the semiconductor element 2 and the thin film insulating tape 1 is sealed as air bubbles in the sealing resin 5. It is difficult to completely prevent air bubbles from being generated in the sealing resin 5.

In the semiconductor device where air bubbles are generated in the sealing resin for the semiconductor element 2, the air bubbles contains moisture and the like which may cause any failure such as inter-terminal leakage.

At present, there are a demand for multiple pins of the COF semiconductor device and another demand for a smaller and thinner COF semiconductor device. In order to fulfill these requests at the same time, it is not only required that a connector section for external connection in an wiring pattern as well as a connection section to a semiconductor element should be more finely pitched, but also it is required that an insulating tape as well as an wiring pattern should be thinner. In order to make a pitch of an inner lead smaller, it is required that to make a width and a thickness of the inner lead smaller.

There are several subjects to be solved in obtaining the fine-pitched and thinner inner lead. One of the subjects is to improve resin sealability (resin filling) of the semiconductor element. Particularly, the fine-etched and thinner inner lead makes it more difficult to remove air bubbles, which are generated during resin sealing of a semiconductor element, from the sealing resin. Therefore, it is required in the fine-pitched and thinner inner lead to prevent air bubbles from being generated.

As a countermeasure against generation of air bubbles, an opening is provided in the thin film insulating tape as is the case with the above-stated TCP semiconductor device. Another countermeasure is shown in FIG. 16 (FIG. 15 is a cross sectional view taken in the line A-A' of FIG. 16). In FIG. 16, resin is applied along three sides shown with an arrow B or only one side shown with an arrow C of the semiconductor element 2. Air present in a resin application region before resin application is removed through a non resin application region to the air.

However, the above-stared conventional countermeasures against air bubbles in the COF semiconductor devices have following subjects.

In the case of she former countermeasure where an opening is provided in the thin film insulating tape, sealing resin overflows from the opening of the thin film insulating tape to a lower part Thereof during the process of resin sealing. The overflowed sealing resin adheres to a stage, which leads to any manufacturing failure. In addition, the thus-manufactured COF semiconductor devices result in becoming thicker, which is against the recent demand for thinner semiconductor devices.

In the case of the latter countermeasure where resin is applied along three sides or only one side of the semiconductor element 2 as shown in FIG. 16, the sealing resin 5 flows at a higher velocity from a corner of the semiconductor element 2, where an interval between inner leads becomes wider, to a space between the semiconductor element 2 and the insulating tape. This may result in taking air in the resin to generate air bubbles.

In addition, if the COF semiconductor device after installation is used in a temperature cycling environment where a low temperature and a high temperature are alternately repeated, thermal expansion and contraction are repeated due to the temperature cycling. Accordingly, due to difference in thermal expansion coefficient of materials, stress is generated around an edge of a solder resist opening which is provided for establishing electrical connection between the inner leads and the semiconductor element, which may cause disconnection of the inner leads.

Another problem involved in implementing a fine-pitched and thinner inner lead is that inner leads around the edge of the solder resist opening may be more remarkably disconnected in the temperature cycling because mechanical strength of the inner leads is decreased as a result of making the inner lead thinner. Therefore, for making the inner leads of the COF semiconductor device fine-pitched and thinner, mechanical strength of the inner lead section around the edge of the solder resist opening should be improved, which indicates that implementation of the fine-pitched device is difficult in the current state,

SUMMARY OF THE INVENTION

It is an object of the present invention to provide a tape for COF and a semiconductor device therewith, which tape is capable of preventing air bubbles from being generated during resin sealing of a semiconductor element and capable of decreasing disconnection of an inner lead located at a corner of the semiconductor element.

In order to accomplish the above object, a first aspect of the present invention provides a tape for chip on film on which a semiconductor element is mounted and resin is applied for sealing the semiconductor element, the tape for chip on film comprising:

an insulating tape;

a plurality of wiring patterns formed on the insulating tape;

a solder resist partially covering the wiring patterns by application to have an opening; and a dummy pattern provided at a corner of a region for the semiconductor element to be mounted so as to control flow of the resin from the corner to a space between a surface of the semiconductor element and the insulating tape during resin sealing.

The tape for chip on film according to the above constitution decreases a flow velocity of the resin flowing from the corner to the space between the surface of the semiconductor element and the insulating tape, which reduces air taken in the resin caused by the resin flow, resulting in prevention of air bubble generation.

In an embodiment of the first aspect of the present invention, the dummy pattern is provided inside the opening of the solder resist and inside or outside the corner, and a shape of the dummy pattern is formed along a shape of the corner.

According to the above constitution, the thickness of the dummy pattern can be larger than the space between the semiconductor element and the insulating tape when the dummy pattern is provided outside the corner in particular, which effectively reduces flow of the sealing resin to the space between the surface of the semiconductor element and the insulating tape during resin sealing.

In an embodiment of the first aspect of the present invention, the dummy pattern is provided from outside or inside the corner to the solder resist.

According to the above constitution, the dummy pattern is connected with the solder resist. Therefore, the dummy pattern can absorb part of stress generated due to repeated thermal expansion and contraction around the opening edge of the solder resist, which decreases stress put on the inner lead located at the corner. As a result, disconnection of the inner lead can be prevented.

In an embodiment of the first aspect of the present invention, the dummy pattern is composed of a large width section of an inner lead of a wiring pattern inside the opening of the solder resist.

The large width section of the inner lead also controls flow of the resin from the corner to the space between the semiconductor element and the Insulating tape during resin sealing.

In an embodiment of the first aspect of the present invention, the dummy pattern is provided at least at two adjacent corners of the region for the semiconductor element to be mounted.

It is possible to prevent air from being taken in the resin at the two adjacent corners during application of sealing resin since the dummy pattern is disposed at the two adjacent corners.

In an embodiment of the first aspect of the present invention, material and thickness of the dummy pattern is the same as those of the inner lead.

According to the above constitution, the dummy pattern can be formed at the same time when the wiring patterns are formed, which saves an additional process and material for forming the dummy pattern.

A second aspect of the present invention provides a tape for chip on film on which a semiconductor element is mounted and resin is applied for sealing the semiconductor element, the tape for chip on film comprising:

an insulating tape;

a plurality of wiring patterns formed on the insulating tape; and a solder resist partially covering the wiring patterns by application to have an opening, wherein an opening edge of the solder resist opposed to a corner of a region for the semiconductor element to be mounted is located in a vicinity of the corner, and a shape of the opening edge of the solder resist in the vicinity of the corner is made along a shape of the corner so as to control flow of resin from the corner to a space between a surface of the semiconductor element and the insulating tape during resin sealing.

According to the above constitution, the solder resist opposed to the corner of the region for the semiconductor element to be mounted is made near and along the corner. Therefore, the solder resist controls the flow rate of resin from the corner to the space between the surface of the semiconductor element and the insulating tape during resin sealing. This results in prevention of air bubble generation.

A third aspect of the present invention provides a tape for chip on film on which a semiconductor element is mounted and resin is applied for sealing the semiconductor element, the tape for chip on film comprising:

an insulating tape;

a plurality of wiring patterns formed on the insulating tape;

a solder resist partially covering the wiring patterns by application to have an opening; and an inner lead in a wiring pattern located on a specified side of a region for the semiconductor element to be mounted inside the opening of the solder resist, wherein the inner lead has a large width section wider than an electric connection section of the inner lead connected to the semiconductor element so as to control flow of resin from the specified side to a space between a surface of the semiconductor element and the insulating tape during resin sealing.

According to the above constitution, the large width section of the inner lead on the specified side of the region for the semiconductor element to be mounted decreases a flow velocity of the resin flowing from the specified side to the space between the surface of the semiconductor element and the insulating tape, which reduces air taken in the resin caused by the resin flow, resulting in prevention of air bubble generation.

In an embodiment of the third aspect of the present invention, the large width section of the inner lead is disposed either outside or inside a border line of the region for the semiconductor element to be mounted, or from outside to inside the border line of the region.

According to the above constitution, the large width section of the inner lead controls flow of resin from the border line of the region for the semiconductor element to be mounted to the space between the semiconductor element and the insulating tape during resin sealing.

In an embodiment of the third aspect of the present invention, the large width section of the inner lead is disposed from outside or inside a border line of the region for the semiconductor element to be mounted to inside a region for the solder resist to be applied.

According to the above constitution, the large width section of the inner lead not only controls flow of resin, but also improves mechanical strength of the inner lead because the large width section of the inner lead is disposed inside the solder resist. This increases disconnection of the inner lead caused by stress that is generated in the vicinity of the opening edge of the solder resist due to repeated thermal expansion and contraction.

In an embodiment of the third aspect of the present invention, there is proved the tape for chip on film, further comprising:

a dummy pattern provided at a corner of a region for the semiconductor element to be mounted so as to control flow of the resin from the corner to a space between a surface of the semiconductor element and the insulating tape during resin sealing.

In an embodiment of the third aspect of the present invention, an opening edge of the solder resist opposed to a corner of a region for the semiconductor element to be mounted is located in a vicinity of the corner, and a shape of the opening edge of the solder resist in the vicinity of the corner is made along a shape of the corner so as to control flow of resin from the corner to a space between a surface of the semiconductor element and the insulating tape during resin sealing.

In an embodiment of the second aspect of the present invention, there is proved the tape for chip on film, further comprising:

a dummy pattern provided at a corner of a region for the semiconductor element to be mounted so as to control flow of the resin from the corner to a space between a surface of the semiconductor element and the insulating tape during resin sealing.

According to the above three embodiments based on combination between the fist, second and third aspect of the present invention, there are obtained such synergical effects as described in the fist, second and third aspect of the present invention.

In an embodiment of the third aspect of the present invention, the wiring pattern, the inner lead, and the dummy pattern are fixed to the insulating tape without use of an adhesive.

In an embodiment of the third aspect of the present invention, the wiring pattern, the inner lead, and the dummy pattern are fixed to he insulating tape with use of an adhesive.

A fourth aspect of the present invention provides a semiconductor device comprising a semiconductor element mounted on the tape for chip on film as described above.

According to the above semiconductor device, air bubbles generated during sealing of the semiconductor element with resin are eliminated. This prevents such a failure as inter-terminal leakage caused by moisture and the like contained in the air bubbles.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention will be described hereinafter in detail with reference to drawings.

Figure 1:
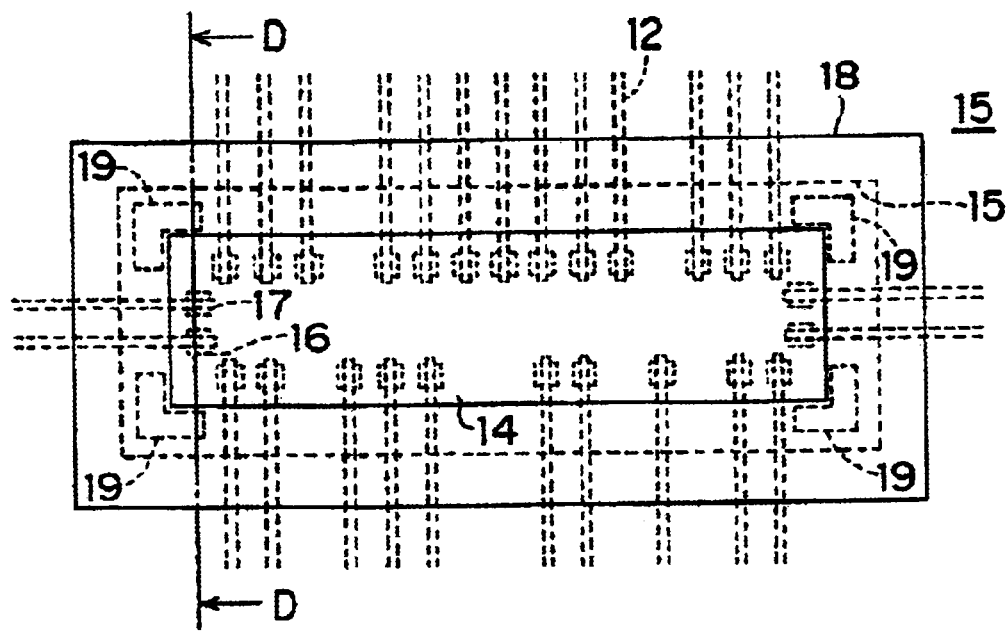
FIG. 1 is a plane view showing a COF semiconductor device according to the present invention.
Figure 2:
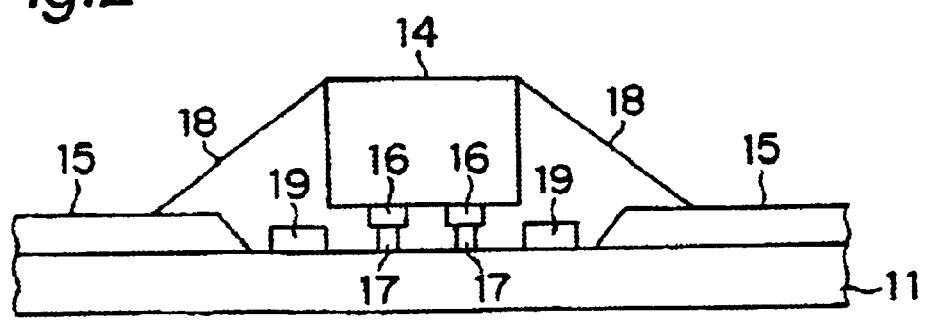
FIG. 2 is a cross sectional view taken along a line D-D' of FIG. 1.
Figure 3:
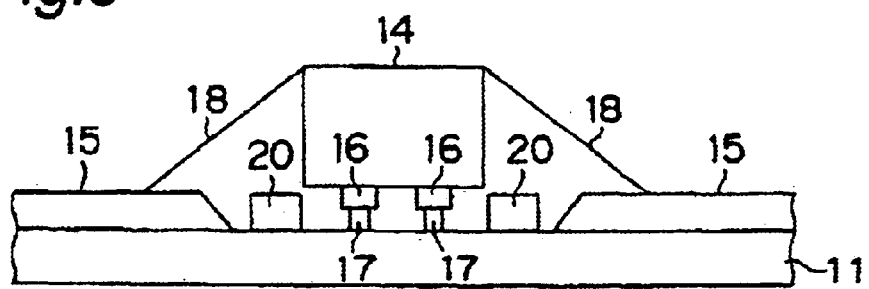
FIG. 3 is a cross sectional view different from FIG. 2.
Figure 4:
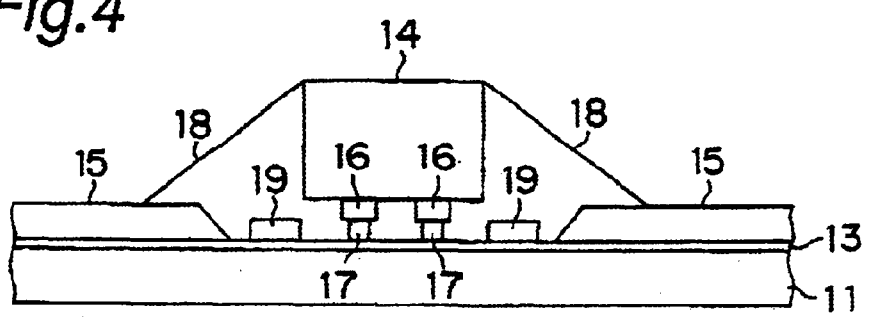
FIG. 4 is a cross sectional view different from FIGS. 2 and 3.

FIG. 1 is a plane view showing a COF semiconductor device as a semiconductor device according to a first embodiment of the present invention. FIG. 2 is a cross sectional view taken along a line D-D' of FIG. 1. FIGS. 3 and 4 are cross sectional views different from that shown in FIG. 2 as modified examples of the first embodiment.

A tape carrier used in the COF semiconductor device is composed of a freely foldable and highly flexible filmy polyimide-based insulating tape 11, whose width is any one of 15 $\mu$m, 20 $\mu$m, 25 $\mu$m, 38 $\mu$m or 40 $\mu$m, as a base material. On the surface of the polyimide-based insulating tape (hereinafter just referred to as an insulating tape) 11, there is formed a copper foil pattern 12, whose width is any one of 8 $\mu$m, 9 $\mu$m, 12 $\mu$m, 15 $\mu$m or 18 $\mu$m, without use of an adhesive (FIGS. 2 and 3), or with use of an adhesive 13 (FIG. 4). The surface of the copper foil pattern 12 is tin-plated or gold-plated (unshown). Pattern exposure portions of the copper foil pattern 12 other than a connection section to a semiconductor element 14 and a connector (unshown) for external connection are covered with a solder resist 15 to secure an insulating state.

The insulating tape 11 does not have an opening in a position on which the semiconductor element 14 is mounted. On each terminal of the semiconductor element 14, there is formed a protruding electrode called a bump 16. The bump 16 of the semiconductor element 14 is electrically connected to an inner lead 17 of the copper foil pattern 12 mounted on the surface of the insulating tape 11. After the semiconductor element 14 is coupled to and mounted on the tape carrier, a space between the semiconductor element 14 and the tape carrier is filled with a resin 18 to seal the semiconductor element 14. The connector for external connection of the copper foil pattern 12 is connected to a liquid crystal display panel, a printed circuit board, and the like.

In the COF semiconductor device according to the present embodiment, there is provided a dummy pattern 19, independent of the copper foil pattern 12 or the inner lead 17 and the solder resist 15, at corners of a resin sealing region on the insulating tape 11 (via a adhesive 13 in the case of FIG. 4). The dummy patterns 19 are disposed outside of the four corners of the square semiconductor element 14, and each of the dummy patterns 19 has a plane shape along each corner of the semiconductor element 14.

A material of the above-stated dummy pattern 19 is the same as that of the inner lead 17, which is electrically connected to the semiconductor element 14. The dummy pattern 19 is formed when the copper foil pattern 12 including the inner lead 17 is manufactured by using the same manufacturing method. A thickness of the dummy pattern 19 may be the same as that of the inner lead 17 as shown in FIGS. 2 and 4 or may be different from that of the inner lead 17 as shown in FIG. 3 where a dummy pattern 20 is used instead of the dummy pattern 19. Effect of the dummy pattern 19 depends on a shape, a thickness and a mounting location of the dummy pattern 19 or combinations thereof. The combinations can be selected depending or a application method of sealing resin or a target pattern of the dummy pattern.

In the present embodiment, as stated above, the dummy patterns 19 and 20 are provided along the corner of the semiconductor element 14 on the tape carrier which is composed of the copper foil pattern 12 formed on the insulating tape 11. This decreases a flow velocity of the sealing resin 18 flowing from the corner of the semiconductor element 14 to the space between the surface of the semiconductor element 14 and the Insulating tape, which makes it possible to control air taken in the resin, resulting In prevention of air bubbles generated in resin sealing of the semiconductor element 14. Therefore, a rate of air bubble generation can be reduced to 50% or less when compared with the conventional COF semiconductor device.

Figure 5:
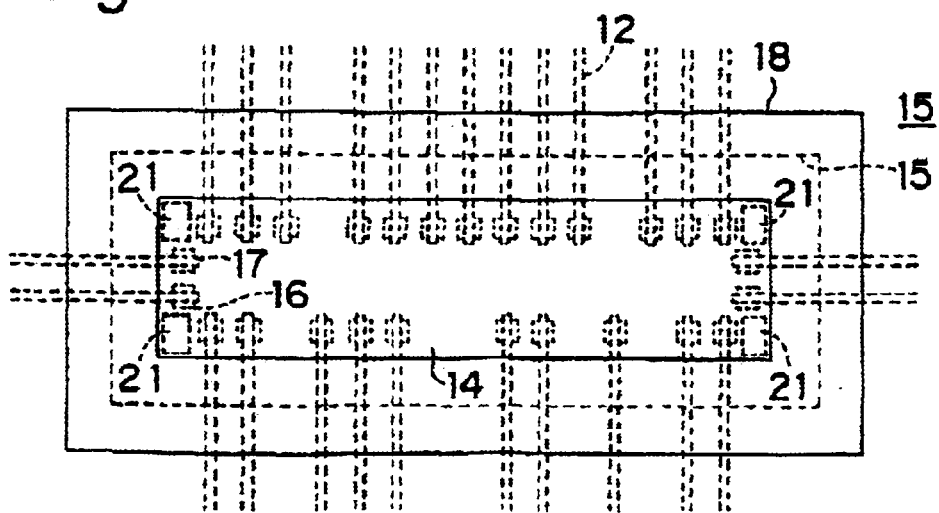
FIG. 5 is a plane view showing a modified example of the COF semiconductor device shown in FIG. 1.
Figure 6:
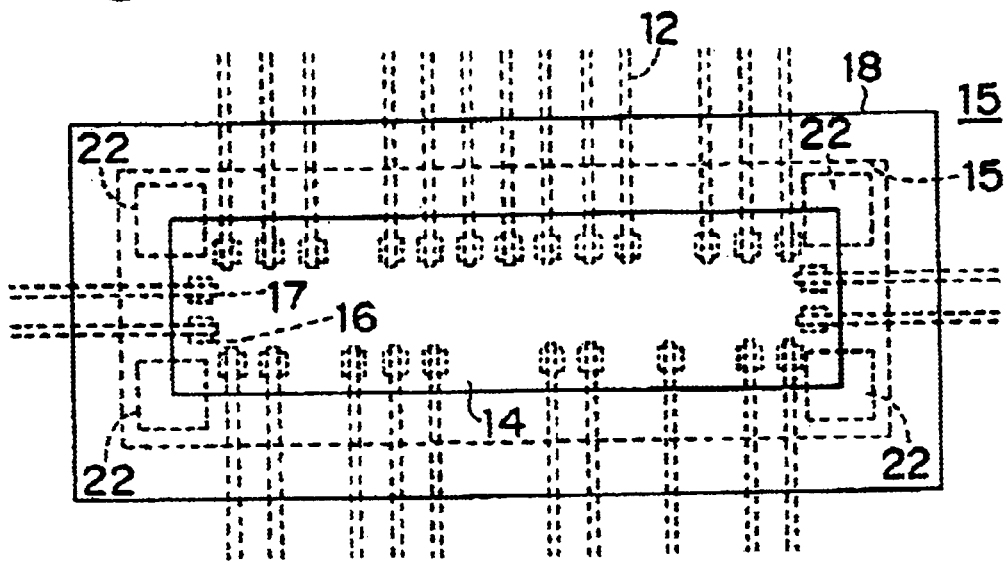
FIG. 6 is a view showing a modified example different from FIG. 5.
Figure 7:
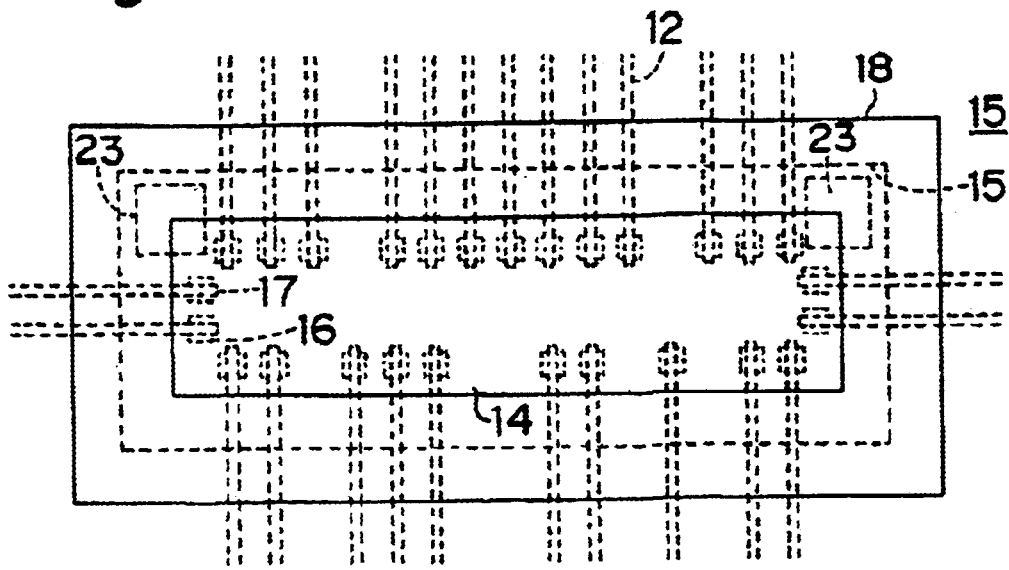
FIG. 7 a view showing a modified example different from FIGS. 5 and 6.

A mounting location of the dummy patterns 19 and the number thereof to be mounted are not limited to those shown in FIG. 1. In FIG. 5, each of dummy patterns 21 is disposed inside along the corner of the semiconductor element 14. In FIG. 6, each of dummy patterns 22 is disposed from the outside to the inside of the corner of the semiconductor element 14. It should be noted, as shown in FIG. 1, that disposing the dummy pattern 19 outside the semiconductor element 14 makes it possible to set a thickness of the dummy pattern 19 larger than the space between the semiconductor element 14 and the insulating tape 11, which implements more effective control on flow of the resin 18 to the space between the surface of the semiconductor element 14 and the insulating tape. It is also possible, as shown in FIG. 7, to install the dummy pattern 23 at two corners located, for example, at both ends of a resin application side in the case where the resin 18 is applied i.e. injected to one side along the semiconductor element 14. This prevents air present at both ends of the resin application side from being taken in the resin 18.

Figure 8:
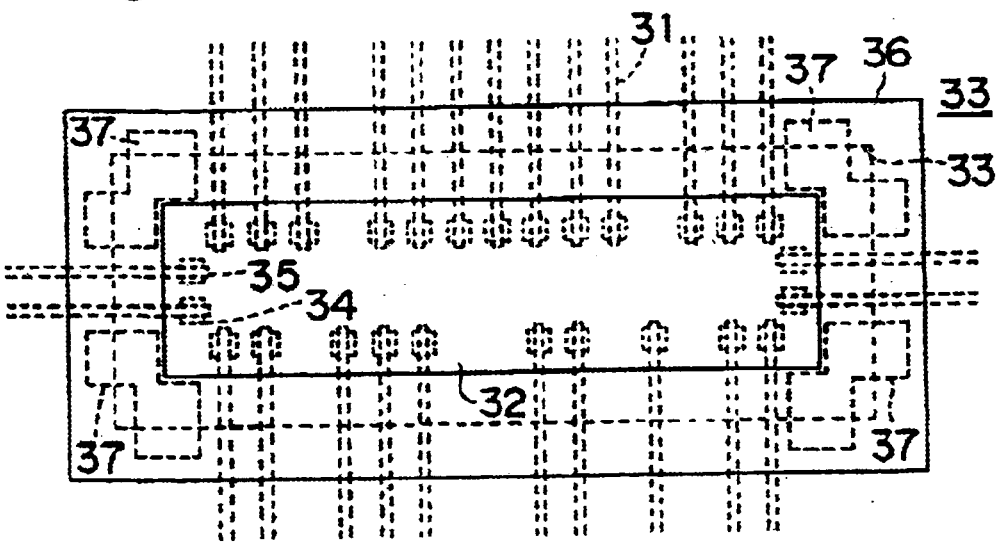
FIG. 8 is a plane view showing a COF semiconductor device different from that shown in FIG. 1.

FIG. 8 is a plane view showing a COF semiconductor device as a semiconductor device according to a second embodiment of the present invention. A cooper foil pattern 31, a semiconductor element 32, a solder resist 33, a bump 34, an inner lead 35, and a resin 36 have the same constitution as the copper foil pattern 12, the semiconductor element 14, the solder resist 15, the bump 16, the inner lead 17, and the resin 18 in the first embodiment shown in FIGS. 1 and 2. Like the first embodiment, the copper foil pattern 31 is also formed on a polyimide-based insulating tape to constitute a tape carrier.

A dummy pattern 37 according to the present embodiment is disposed at a corner of the semiconductor element 32 in a region of the sealing resin 36, in such a way as being extended from outside an outline of the semiconductor element 32 to inside an inner forming region of the solder resist 33.

In the conventional COF semiconductor device, under temperature cycling, thermal expansion and contraction stresses repeatedly generate around an edge of an opening of the solder resist. There is a tendency that those stresses cause the inner leads 35 to generate disconnection at the corners of the semiconductor element 32 where intervals between the inner leads 35 are large. However, In the COF semiconductor device of the present embodiment, the dummy pattern 37 is formed at the corners of the semiconductor element 32 around the edges of the opening of the solder resist 33. Accordingly, the dummy pattern 37 car absorb part of the thermal stresses, and therefore stresses applied to the inner leads 35 at the corners of the semiconductor element 32 are decreased. As a result, the number of temperature cycling till occurrence of disconnection of the inner lead 35 located at the corners of the semiconductor element 32 can be increased 1.5 to 2 times the conventional number. As is the case with the first embodiment, a rate of air bubble generation in the resin sealing process of the semiconductor element 32 can be decreased to 50% or less of the conventional rate.

Figure 9:
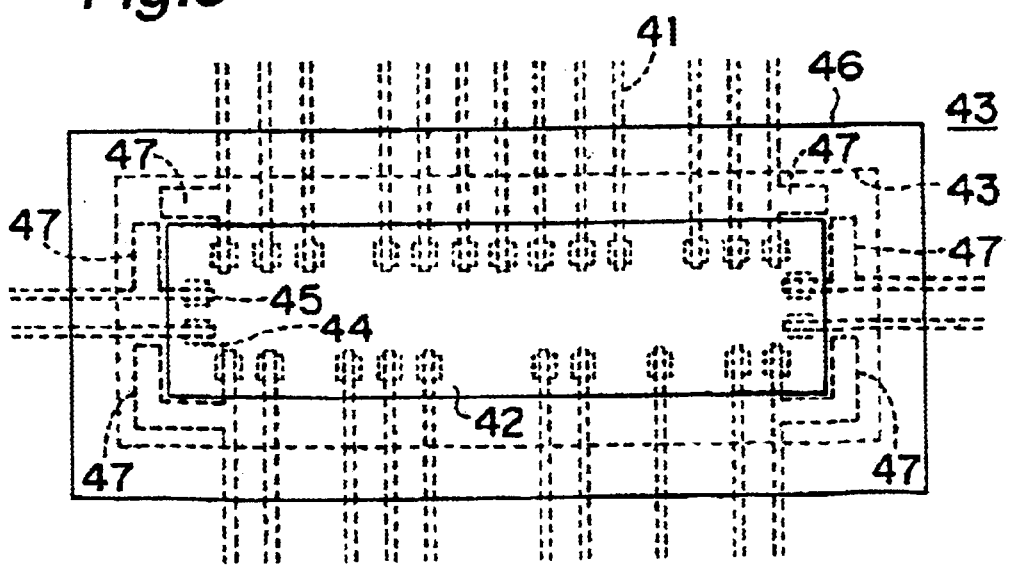
FIG. 9 is a plane view showing a COF semiconductor device different from those shown in FIGS. 1 and 8.

FIG. 9 is a plane view showing a COF semiconductor device as a semiconductor device according to a third embodiment of the present invention. A copper foil pattern 41, a semiconductor element 42, a solder resist 43, a burp 44, an inner lead 45 and a resin 46 have the same constitution as the copper foil pattern 12, the semiconductor element 14, the solder resist 15, the bump 16, the inner lead 17 and the resin 18 in the first embodiment shown in FIGS. 1 and 2. Like the first embodiment, the copper foil pattern 41 is also formed on a polyimide-based insulating tape to constitute a tape carrier.

In the COF semiconductor device according to the present embodiment, a dummy pattern 47 which is disposed at a corner of the semiconductor element 42 in a region of the resin 46 for sealing the semiconductor element 42 is formed not independently but as a part of the inner lead 45. That is to say, the dummy pattern 47 is formed by partially enlarging the width of the inner lead 45 located at the corners of the semiconductor element 42. This saves an additional process and material for forming the dummy pattern, and therefore enables reduction of manufacturing costs. A rate of air bubble generation in the resin sealing process of the semiconductor element 42 can be also decreased to 50% or less of the conventional rate when compared with the conventional COF semiconductor element.

Figure 10:
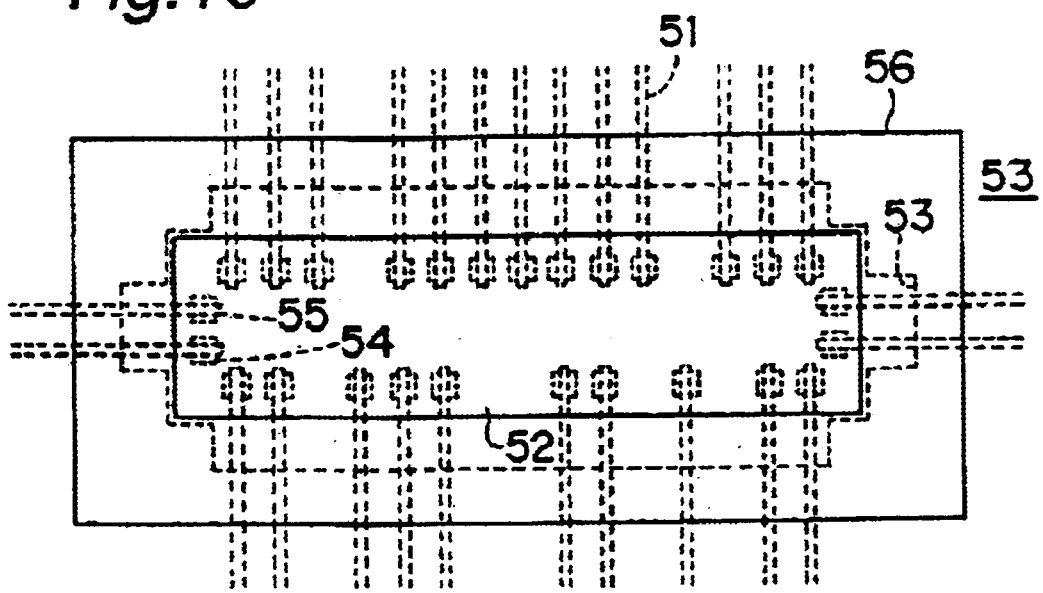
FIG. 10 is a plane view showing a COF semiconductor device different from those shown in FIGS. 1, 8, and 9.

FIG. 10 is a plane view showing a COF semiconductor device as a semiconductor device according to a fourth embodiment of the present invention. A cooper foil pattern 51, a semiconductor element 52, a bump 54, an inner lead 55, and a resin 56 have the same constitution as the copper foil pattern 12, the semiconductor element 14, the bump 16, the inner lead 17, and the resin 18 in the first embodiment shown in FIGS. 1 and 2. Like the first embodiment, the copper foil pattern 51 is also formed on a polyimide-based insulating tape to constitute a tape carrier.

In the COF semiconductor device of the present embodiment, instead of disposing the dummy patterns 19 to 23, 37, and 47 described in each of the above stated embodiments, an outline of an opening of the solder resist 53 at a corner of the semiconductor element 52 is formed along an outline of the corner of the semiconductor element 52. The solder resist 53 at the corner of the semiconductor element 52 has the same effect as that in the case of disposing the dummy patterns.

Therefore, in the case of the COF semiconductor device of the present embodiment, a rate of air bubble generation during resin sealing of the semiconductor element 52 can be decreased to 50% or less of the conventional rate when compared with the conventional COF semiconductor element.

Figure 11:
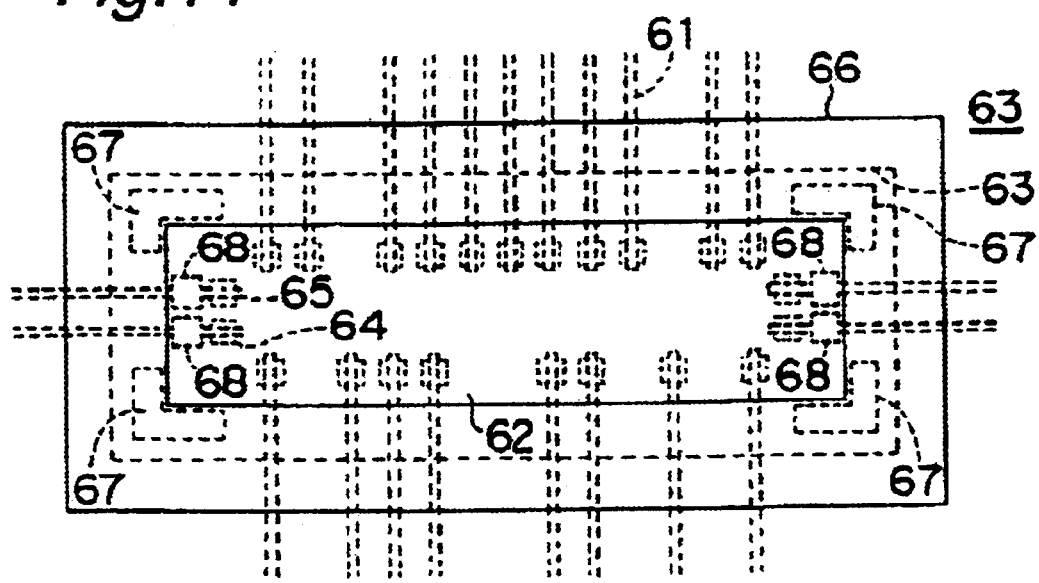
FIG. 11 is a plane view showing a COF semiconductor device different from those shown in FIGS. 1, and 8 to 10.

FIG. 11 is a plane view showing a COF semiconductor device as a semiconductor device according to a fifth embodiment of the present invention. A copper foil pattern 61, a semiconductor element 62, a solder resist 63, a bump 64 and a resin 66 have the same constitution as the copper foil pattern 12, the semiconductor element 14, the solder resist 15, the bump 16 and the resin 18 in the first embodiment shown in FIGS. 1 and 2. Like the first embodiment, the copper foil pattern 61 is also formed on a polyimide-based insulating tape to constitute a tape carrier.

In the COF semiconductor device of the present embodiment, not only an independent dummy pattern 67 is provided at a corner of the semiconductor element 62 in a forming region of sealing resin 66, but also a large width section 68 of the inner lead 65 is provided under a region of the semiconductor element 62 on a specified side of the semiconductor element 62, the large width section 68 being larger than that of an electric connection section of the inner lead 65. It is preferable that the width of the large width section 68 is a half of an inner lead pitch or more. Effect differs depending on combinations of a resin application/injection method and a target pattern of the dummy pattern, and therefore an effective combination is appropriately selected.

For resin-sealing of the semiconductor element 62, when resin is applied or injected along the semiconductor element 62, where first resin application is made on a long side of the semiconductor element 62, and second and third resin application are made on short sides of the semiconductor element 62. In the present embodiment, the large width section 68 of the inner lead 65 is provided under the semiconductor element 62 on the short sides thereof. Therefore, during resin sealing, the large width section 68 controls i.e. suppresses flow of the resin 66 from the short sides to the space between the semiconductor element 62 and the insulating tape. This decreases a flow velocity of the resin 66 flowing from the two short sides to the space between the semiconductor element 62 and the insulating tape, which reduces air taken in the resin caused by the resin flow, resulting in prevention of air bubble generation. According to the present embodiment, a rate of air bubble generation in the resin sealing process of the semiconductor element can be decreased to 50% or less when compared with the conventional COF semiconductor device.

Figure 12:
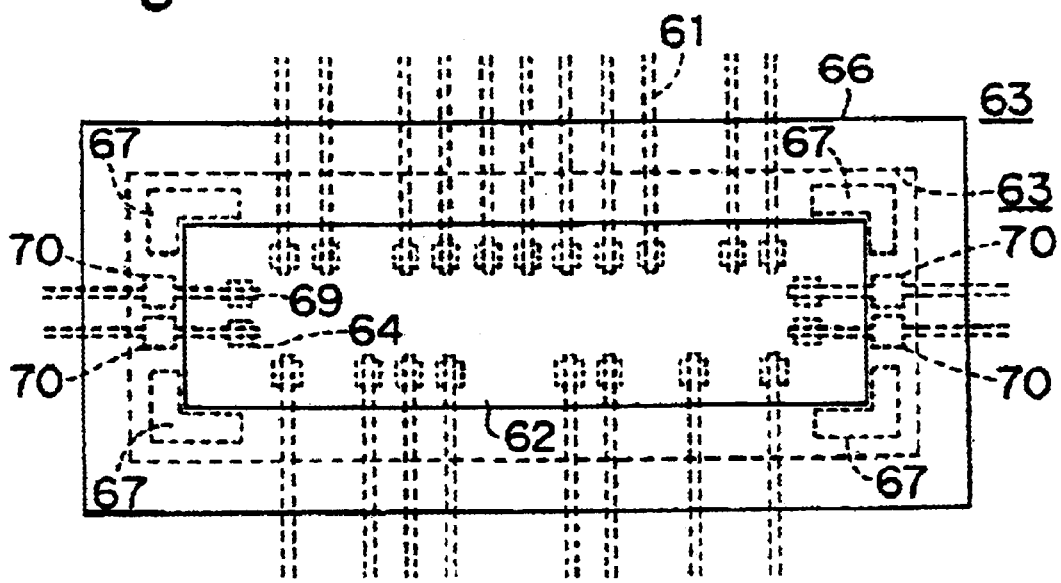
FIG. 12 is a plane view showing a modified example of the COF semiconductor device shown in FIG. 11.
Figure 13:
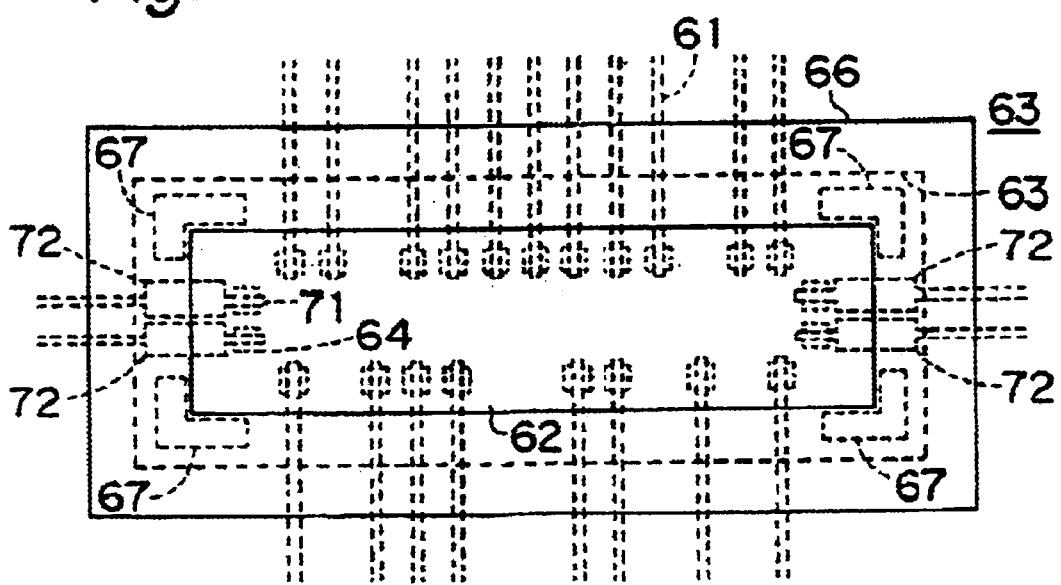
FIG. 13 is a view showing a modified example different from that shown in FIG. 12.

FIGS. 12 and 13 show modified examples of the COF semiconductor device shown in FIG. 11.

FIG. 12 s a plane view in the case of providing a large width section 70, whose width is larger than that of an electric connection section, on an inner lead 69 on the short side of the semiconductor element 62 outside the semiconductor element 62.

FIG. 13 is a plane view in the case of providing a large width section 72, whose width is larger than that of an electric connection section, on an inner lead 71 on the short side of the semiconductor element 62 in such a way as to be extended from the inside to the outside of the semiconductor element 62.

In the present embodiment, a specified side on which the large width sections 68, 70, and 72 are disposed is not limited to the short side, and may be a long side if it is the second or later application side when applying the resin 66 along the semiconductor element 62.

Figure 14:
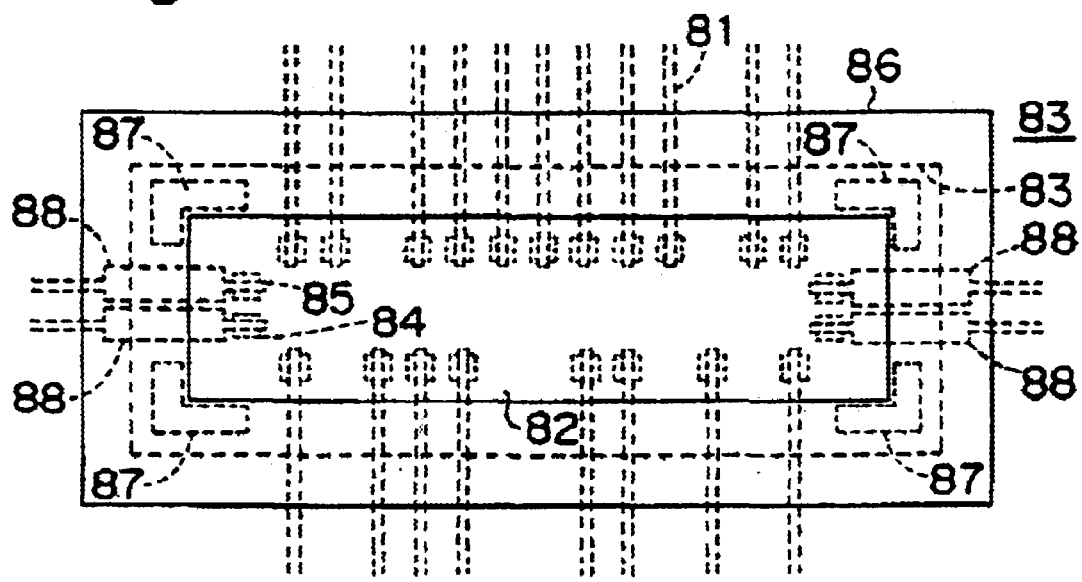
FIG. 14 is a plane view showing a COF semiconductor device different from those shown in FIGS. 11 and 8 to 11.
Figure 15:
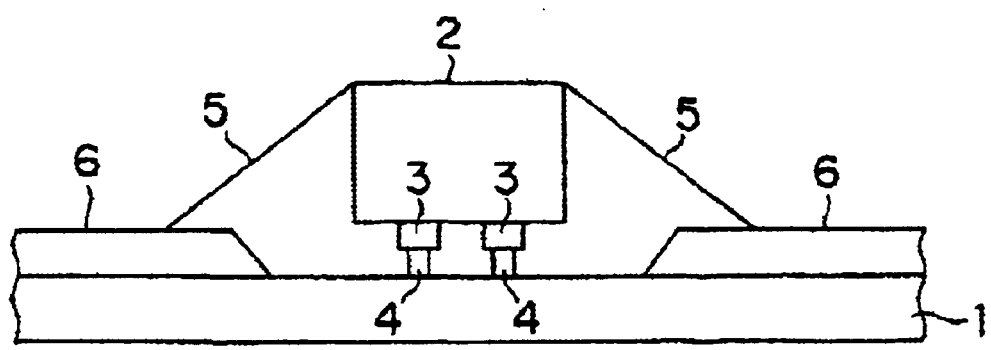
FIG. 15 is a cross sectional view showing a conventional COF semiconductor device.
Figure 16:
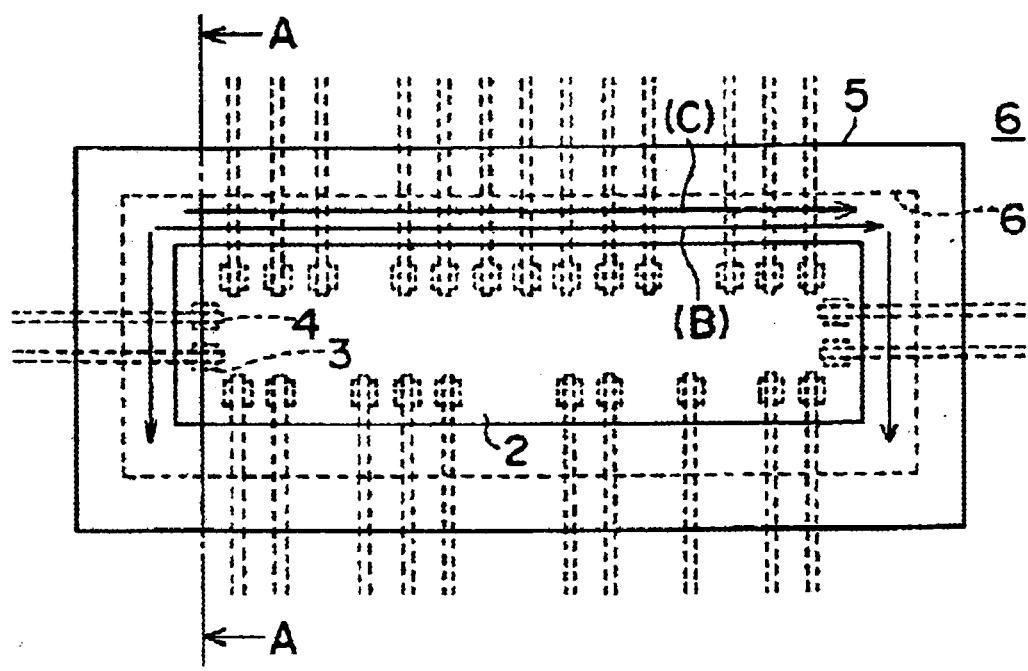
FIG. 16 is a plane view showing the COF semiconductor device shown in FIG. 15.

FIG. 14 is a plane view showing a COF semiconductor device as a semiconductor device according to a sixth embodiment of the present invention. A copper foil pattern 81, a semiconductor element 82, a solder resist 83, a bump 84 and a resin 86 have the same constitution as the copper foil pattern 12, the semiconductor element 14, the solder resist 15, the bump 16 and the resin 18 in the first embodiment shown in FIGS. 1 and 2. Like the first embodiment, the copper foil pattern 81 is also formed on a polyimide-based insulating tape to constitute a tape carrier.

In the COF semiconductor device according to the present embodiment, not only an independent dummy pattern 87 is provided at a corner of the semiconductor element 82 in a forming region of sealing resin 86, but also a large width section 88, whose width is larger than that of an electric connection section, is provided on an inner lead 85 on a specified side of the semiconductor element 82 in such a way as being extended from a forming region of the semiconductor element 82 to a forming region of the solder resist 83.

In the conventional COF semiconductor device, under temperature cycling, repeated thermal expansion and contraction stresses generate around a solder resist opening, and those stresses cause inner leads to generate disconnection at a place where intervals between the inner leads are large. On the other hand, in the COF semiconductor device of the present embodiment, mechanical strength of the inner lead 85 around the opening of the solder resist 83 is excellent since a portion of the large width section 88 of the inner lead 85 is formed in the solder resist 83. The number of Temperature cycling till occurrence of failure due to disconnection of the inner lead 85 can be increased 1.5 to 2 times the conventional number. As is the case with the first embodiment, a rate of air bubble generation in the resin sealing process of the semiconductor element 32 can be decreased to 50% or less of the conventional rate.

The COF semiconductor devices according to the first to sixth embodiments are different from the conventional COF semiconductor device in the following points:

the dummy patterns 19 to 23, 37, 47, 67 and 87 are provided at the corners of the semiconductor elements 14, 32, 42, 52, 62 and 82;

the large width sections 68, 70, 72 and 88, whose width is larger than that of the electric connection section, are provided on the inner leads 65, 69, 71 and 85 on a specified side of the semiconductor elements 62 and 82; and the above two are adequately combined.

The above-stated different points can be each implemented only by changing pattern designs, which enables manufacturing of the COF semiconductor device of the present invention without drastically changing a manufacturing facility and a manufacturing method of the conventional COF semiconductor device.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A tape, for chip on film, on which a semiconductor element is mounted and resin is applied for sealing the semiconductor element, the tape for chip on film comprising:
   an insulating tape, wherein the semiconductor element is supported by the insulating tape and no aperture is defined in the insulating tape in an area under the semiconductor element;
   a plurality of wiring patterns formed on the insulating tape;
   a solder resist partially covering the wiring patterns in a form such that an opening is defined in the solder resist at least in all or part of an area under the semiconductor element; and
   a dummy pattern supported by the insulating tape adjacent a corner of a region for the semiconductor element to be mounted so as to control flow of the resin from the corner to a space between a surface of the semiconductor element and the insulating tape during resin sealing.

2. The tape for chip on film as defined in claim 1, wherein the dummy pattern is provided independent of the wiring patterns and the solder resist so that the dummy pattern is not in electrical communication with the wiring patterns or the solder resist.

3. The tape for chip on film as defined in claim 2, wherein the dummy pattern is provided inside the opening of the solder resist and inside or outside the corner, and a shape of the dummy pattern is formed along a shape of the corner.

4. The tape for chip on film as defined in claim 2, wherein the dummy pattern is provided inside the opening of the solder resist and extended from outside to inside the corner.

5. The tape for chip on film as defined in claim 2, wherein the dummy pattern is provided from outside or inside the corner to the solder resist.

6. The tape for chip on film as defined in claim 1, wherein the dummy pattern is composed of a large width section of an inner lead of a wiring pattern inside the opening of the solder resist.

7. The tape for chip on film of claim 6, wherein the wiring pattern, the inner lead, and the dummy pattern are fixed to the insulating tape without use of an adhesive.

8. The tape for chip on film of claim 6, wherein the wiring pattern, the inner lead, and the dummy pattern are fixed to the insulating tape with use of an adhesive.

9. A tape for chip on film as defined in claim 1, wherein the dummy pattern is provided at two adjacent corners of the region for the semiconductor element to be mounted.

10. The tape for chip on film as defined in claim 1, wherein
   material and thickness of the dummy pattern is the same as those of the inner lead.

11. The tape for chip on film of claim 10, wherein the wiring pattern, the inner lead, and the dummy pattern are fixed to the insulating tape without use of an adhesive.

12. The tape for chip on film of claim 10, wherein the wiring pattern, the inner lead, and the dummy pattern are fixed to the insulating tape with use of an adhesive.

13. A semiconductor device comprising a semiconductor element mounted on the tape for chip on film as defined in claim 1 and seal with resin.

14. The tape for chip on film of claim 1, wherein the entire dummy pattern is located laterally beyond the periphery of the semiconductor element.

15. The tape for chip on film of claim 1, wherein the dummy pattern is not part of, and is not connected to, the semiconductor element.

16. A tape for chip on film on which a semiconductor element is mounted and resin is applied for sealing the semiconductor element, the tape for chip on film comprising:
   an insulating tape;
   a plurality of wiring patterns formed on the insulating tape; and
   a solder resist partially covering the wiring patterns, wherein an opening is defined in the solder resist in an area under the semiconductor element, wherein
   a first edge of said opening in the solder resist adjacent a corner of the semiconductor element is located nearer to the corner than a second edge of said opening in the solder resist adjacent the corner different than the first edge so as to control flow of resin from the corner to a space between a surface of the semiconductor element and the insulating tape during resin sealing.

17. The tape for chip on film as defined in claim 16, further comprising:
   a dummy pattern provided at a corner of a region for the semiconductor element to be mounted so as to control flow of the resin from the corner to a space between a surface of the semiconductor element and the insulating tape during resin sealing.

18. A semiconductor device comprising a semiconductor element mounted on the tape for chip on film as defined in claim 16 and sealed with resin.

19. A tape for chip on film on which a semiconductor element is mounted and resin is applied for sealing the semiconductor element, the tape for chip on film comprising:
   an insulating tape, wherein the semiconductor element is supported by the insulating tape and no aperture is defined in the insulating tape in an area under the semiconductor element;
   a plurality of wiring patterns formed on the insulating tape;
   a solder resist partially covering the wiring patterns, wherein an opening is defined in the solder resist at least in all or part of an area under the semiconductor element; and
   an inner lead in a wiring pattern located on a specified side of the semiconductor element is at least partially located inside the opening defined in the solder resist, wherein
   the inner lead has a large width section wider than an electric connection section of the inner lead connected to the semiconductor element so as to control flow of resin from the specified side to a space between a surface of the semiconductor element and the insulating tape during resin sealing, so that air bubbles in the resin located in a gap between a surface of the semiconductor element and the insulating tape can be reduced.

20. The tape for chip on film as defined in claim 19, wherein the large width section of the inner lead is disposed either outside or inside a border line of a region for the semiconductor element to be mounted, or from outside to inside the border line of the region.

21. The tape for chip on film of claim 20, wherein the entire dummy pattern is located under the semiconductor element without contacting the semiconductor element.

22. The tape for chip on film as define in claim 19, wherein the large width section of the inner lead is disposed from outside or inside a border line of the region for the semiconductor element to be mounted to inside a region for the solder resist to be applied.

23. The tape for chip on film as defined in claim 19, further comprising:

A dummy pattern provided at a corner of a region for the semiconductor element to be mounted so as to control flow of the resin from the corner to a space between a surface of the semiconductor element and the insulating tape during resin sealing.

24. The tape for chip on film as defined in claim 23, wherein the wiring pattern, the inner lead, and the dummy pattern are fixed to the insulating tape without use of an adhesive.

25. The tape for chip on film as defined in claim 23, wherein the wiring pattern, the inner lead, and the dummy pattern are fixed to the insulating tape with use of an adhesive.

26. The tape for chip on film as defined in claim 19, wherein an opening edge of the solder resist opposed to a corner of a region for the semiconductor element to be mounted is located in a vicinity of the corner, and a shape of the opening edge of the solder resist in the vicinity of the corner is made along a shape of the corner so as to control flow of resin from the corner to a space between a surface of the semiconductor element and the insulating tape during resin sealing.

27. A semiconductor device comprising a semiconductor element mounted on the tape for chip on film as defined in claim 19 and sealed with resin.

28. The tape for chip on film of claim 19, wherein the entire dummy pattern is located laterally beyond the periphery of the semiconductor element.

29. A tape, for chip on film, on which a semiconductor element is mounted and resin is applied for sealing the semiconductor element, the tape for chip on film comprising:

an insulating tape, wherein the semiconductor element is supported by the insulating tape and no aperture is defined in the insulating tape in an area under the semiconductor element;

a plurality of wiring patterns formed in the insulating tape;

a solder resist partially covering the wiring patterns in a form such that an opening es defined in the solder resist at least in all or part of an area under the semiconductor element; and a dummy pattern supported by the insulating tape adjacent a corner of the semicondrctor element so as to control flow of the resin from the corner to a spac btween a surface of the semiconductor element and the insulating tape during resin sealing, and wherein at least part lf the dummy pattern is located laterlly beyond a periphery of the semiconductor element so that at least part of an upper surface of the dummy pattern is covered with the resin.

* * * * *